United States Patent
Koerner et al.

(10) Patent No.: US 6,719,571 B2
(45) Date of Patent: Apr. 13, 2004

(54) HOUSING WITH AN ELECTRICAL CIRCUIT ACCOMMODATED THEREIN

(75) Inventors: André Koerner, Lippstadt (DE); Ralf Schulze, Lippstadt (DE)

(73) Assignee: Hella KG Hueck & Co., Lippstadt (DE)

( * ) Notice: Subject to any disclaimer, the term of this patent is extended or adjusted under 35 U.S.C. 154(b) by 0 days.

(21) Appl. No.: 10/194,005

(22) Filed: Jul. 15, 2002

(65) Prior Publication Data

US 2003/0013329 A1 Jan. 16, 2003

(30) Foreign Application Priority Data

Jul. 14, 2001 (DE) .......................... 101 34 380

(51) Int. Cl.[7] ................................................ H01R 9/09
(52) U.S. Cl. ...................................................... 439/76.1
(58) Field of Search ................... 439/76.1, 620

(56) References Cited

U.S. PATENT DOCUMENTS

| | | | |
|---|---|---|---|
| 3,501,582 A | | 3/1970 | Heidler et al. ............... 174/52 |
| 3,501,598 A | * | 3/1970 | Lis ............................. 200/11 D |
| 4,760,357 A | * | 7/1988 | Yamaguchi ................. 333/181 |
| 4,993,956 A | * | 2/1991 | Pickles et al. .............. 439/76.1 |
| 5,111,362 A | * | 5/1992 | Flamm et al. ............... 361/736 |
| 5,281,155 A | * | 1/1994 | Comerci et al. ............. 439/107 |
| 5,967,802 A | * | 10/1999 | Daly et al. .................. 439/76.1 |
| 6,283,765 B1 | * | 9/2001 | Lumbis et al. ................ 439/35 |

FOREIGN PATENT DOCUMENTS

| | | |
|---|---|---|
| DE | 37 16 102 A | 11/1988 |
| DE | 40 33 999 | 4/1992 |
| DE | 44 25 716 A | 9/1995 |
| DE | 200 20 392 | 5/2001 |

* cited by examiner

*Primary Examiner*—Tulsidas Patel
*Assistant Examiner*—Phuong Dinh
(74) *Attorney, Agent, or Firm*—Birch, Stewart, Kolasch & Birch, LLP

(57) ABSTRACT

A housing with an electrical circuit accommodated therein, in particular for use in a motor vehicle, includes a top housing part and a bottom housing part, at least one printed circuit board that is separated at least in part from the bottom housing part and has at least one electrical component, and at least one plug element that extends through the bottom housing part and has a plug end that extends into and/or through the printed circuit board from the side of the latter that faces the bottom housing part and is electrically contacted in the area of the printed circuit board. The at least one plug element has at least one support element that extends from the plug element in the space between the bottom housing part and the printed circuit board in such a way that a section of it rests against the side of the bottom housing part facing the printed circuit board.

9 Claims, 3 Drawing Sheets

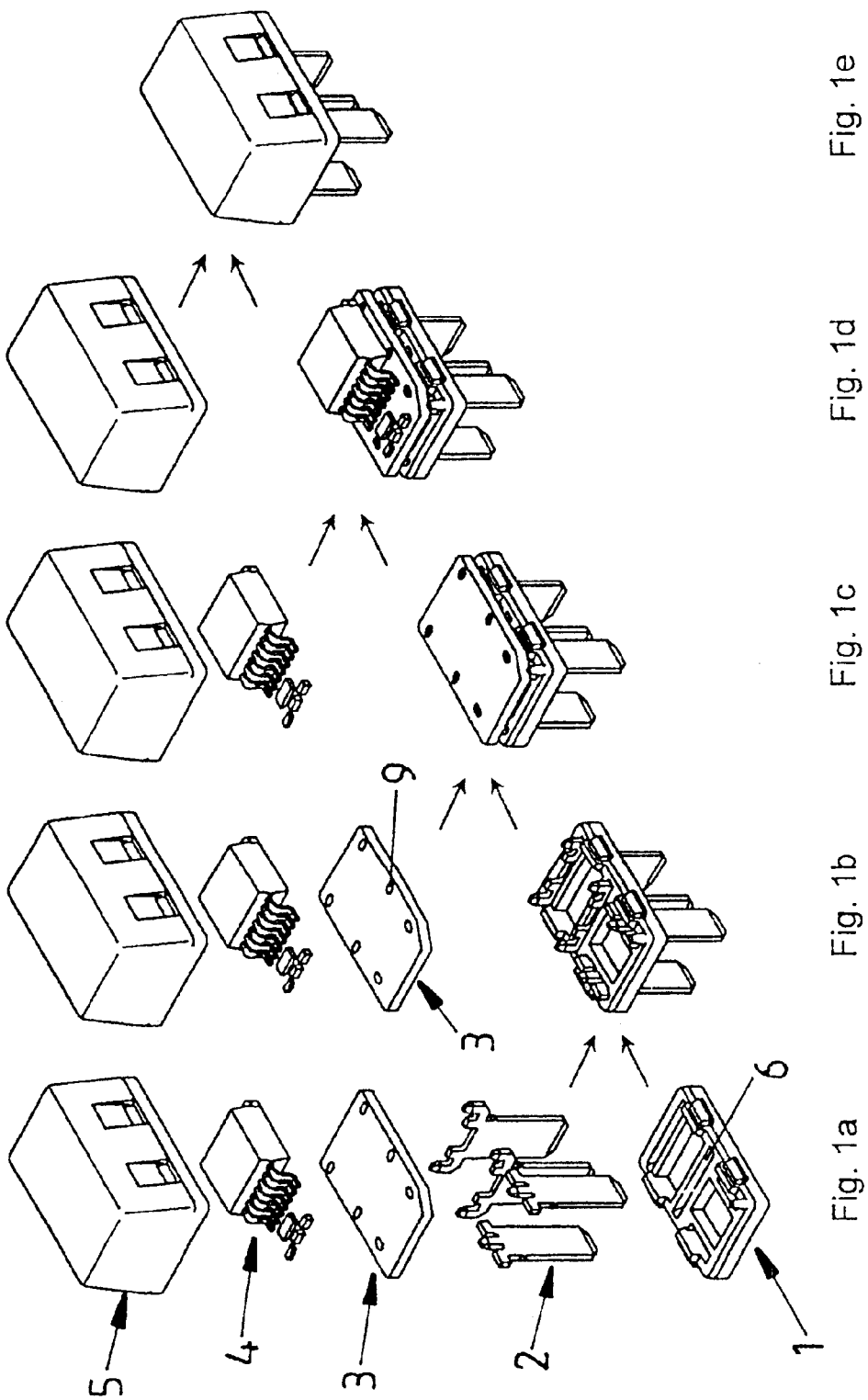

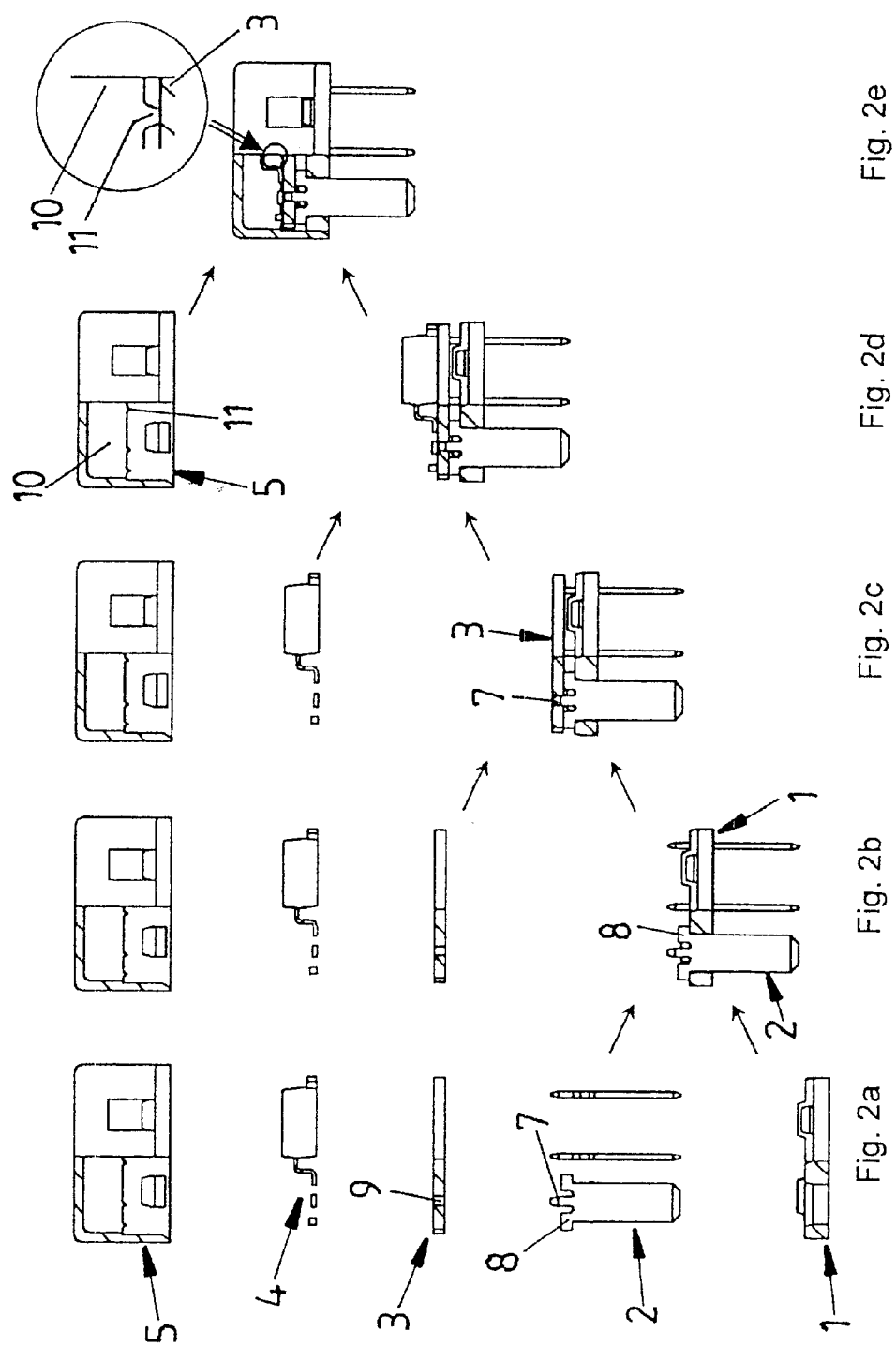

HOUSING WITH AN ELECTRICAL CIRCUIT ACCOMMODATED THEREIN

This nonprovisional application claims priority under 35 U.S.C. § 119(a) on Patent Application No. 101 34 380.9 filed in Germany on Jul. 14, 2001, the entire contents of which are herein incorporated by reference.

BACKGROUND OF THE INVENTION

1. Field of the Invention

The present invention relates to a housing with an electrical circuit accommodated therein, in particular for use in a motor vehicle, including a top housing part and a bottom housing part, at least one printed circuit board that is separated at least in part from the bottom housing part and has at least one electrical component, and at least one plug element that extends through the bottom housing part and has a plug end that extends into and/or through the printed circuit board from the side of the latter that faces the bottom housing part and is electrically contacted in the area of the printed circuit board.

2. Description of the Background Art

As a general rule, in housings of the aforementioned type, the problem exists of preventing mechanical stress on the electrically conductive connection between the at least one plug end and the printed circuit board or components or traces arranged on said printed circuit board. Solutions known from the prior art provide for complex mechanical connections between connector strips bearing plug elements and the printed circuit board. Such mechanical connections entail relatively high manufacturing expenses and thus comparatively high production costs of such a housing.

SUMMARY OF THE INVENTION

The problem that the present invention proposes to solve is the creation of a housing of the aforementioned type which largely avoids mechanical stress on the electrically conductive connection between the at least one plug end and the printed circuit board while being economical to manufacture.

This is achieved in accordance with the invention in that the at least one plug element has at least one support element extending from the plug element in the space between the bottom housing part and the printed circuit board in such a way that a section of it rests against the side of the bottom housing part facing the printed circuit board. The at least one support element is thus an integral constituent of the plug element and can be manufactured by simple means, for example by stamping, when the plug element is manufactured. For example, in the event of tensile force on the plug element away from the printed circuit board, the support element can transmit the force acting on the plug element to the bottom housing part so that the electrically conductive connection between the plug end and printed circuit board is not stressed mechanically.

In accordance with a preferred embodiment of the present invention, a section of the at least one support element rests against the side of the printed circuit board facing the bottom housing part. In this way, in the event of a compressive force on the plug element toward the printed circuit board, the force acting on the plug element is transmitted by the support element to the printed circuit board so that the electrically conductive connection between the plug end and printed circuit board is not stressed mechanically in this case either.

In this context, the at least one support element can extend essentially perpendicular from the plug element with regard to the direction of connection between the bottom housing part and the printed circuit board. The support element here can be designed to be essentially lug-shaped or stud-shaped, for example.

In accordance with a preferred embodiment of the present invention, the top housing part has at least one pressure element, a section of which rests against the side of the printed circuit board facing away from the bottom housing part. Thus, a force exerted on the printed circuit board, for example because of the aforementioned compressive force on the plug element, is transmitted to the top housing part by means of said pressure element. In this way, the printed circuit board is fixed in place in the housing, while mechanical stress on the printed circuit board is also prevented by the transmission of force to the at least one pressure element.

The top housing part here can have at least one housing rib, upon which is arranged the at least one pressure element. A rib of this type, for example running transversely through the housing, represents a very simple way of attaching the pressure elements to the housing. For example, the at least one pressure element can be designed to be stud-shaped here. Such a design minimizes manufacturing costs for the pressure elements.

Advantageously, provision can be made for the bottom housing part to be essentially plate-shaped.

In accordance with a preferred embodiment of the present invention, the top housing part and the bottom housing part are fastened to each other by means of a snap-in connection, wherein latching projections located preferably on the top housing part can engage behind detents located on the bottom housing part. As a result of this snap-in connection, the top housing part is secured against being pulled off.

Moreover, because of the snap-in connection and the aforementioned pressure and support elements, it is possible to assemble the housing simply by pressing it together. Consequently, assembly of the housing can be extremely economical.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description of preferred example embodiments given hereinbelow and the accompanying drawings which are given by way of illustration only, and thus, are not limitive of the present invention, and wherein:

FIGS. 1a–1e are perspective views of step-by-step assembly of a housing in accordance with the invention with an electrical circuit accommodated therein;

FIGS. 2a–2e are partially cross-sectional side views of the step-by-step assembly in FIG. 1;

FIG. 3b is a view in the direction of arrow IIIb in FIG. 3a.

DETAILED DESCRIPTION OF THE PREFERRED EMBODIMENTS

Figure 3A:
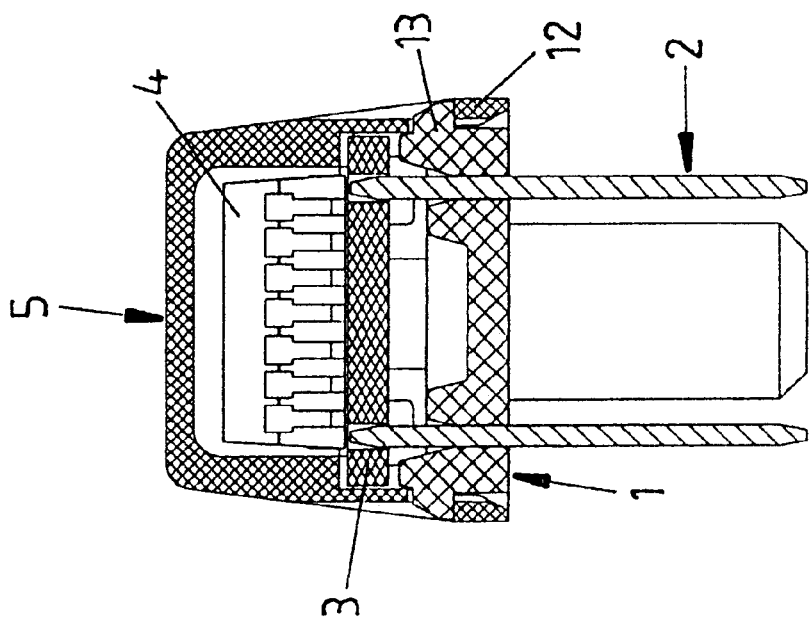
FIG. 3a is a partially cross-sectional side view of an assembled housing in accordance with the invention.
Figure 3B:
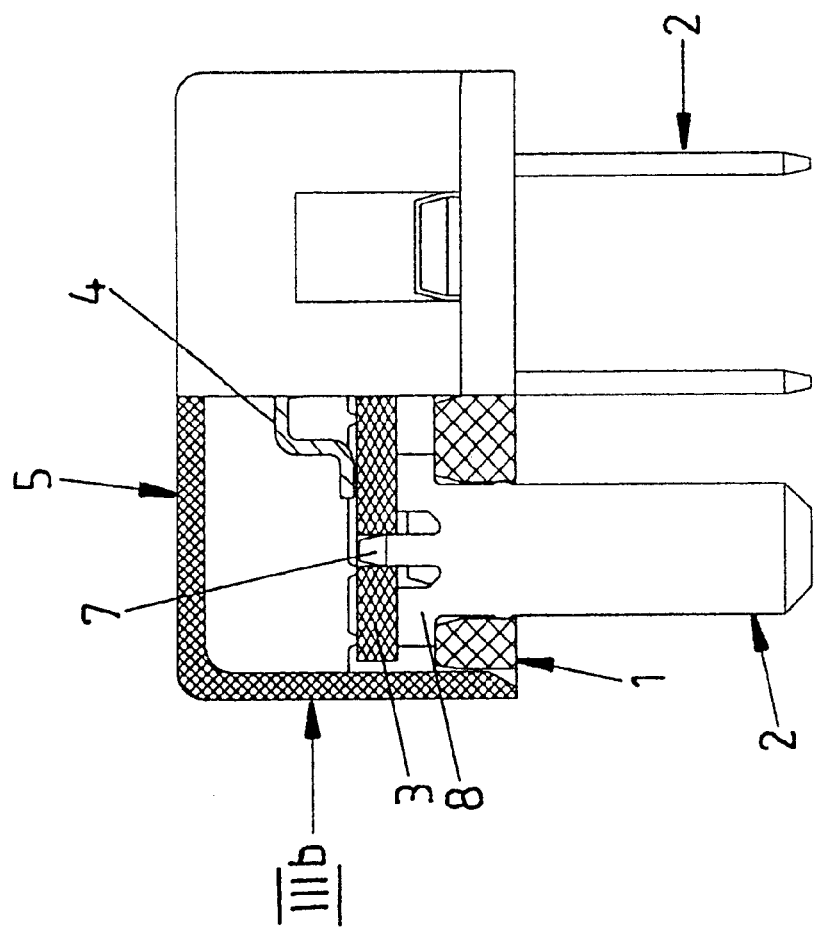

A housing in accordance with the invention shown in FIG. 1 through FIG. 3 comprises mainly a bottom housing part 1, plug elements 2, a printed circuit board 3, electrical components 4, which can take the form of SMD (surface mount device) components, and a top housing part 5.

It can be seen in FIG. 1 and FIG. 2 that the bottom housing part 1 can take the form of a base plate that has slot-like openings 6 through which the plug elements 2 can extend. The progression from FIG. 1a to FIG. 1b illustrates installation of the plug elements 2 in the base plate 1. In the process, the plug elements 2 are inserted from above through the slot-like openings in FIG. 1 and FIG. 2.

As is especially clear in FIG. 2a, the plug elements 2 each have a plug end 7 and at least one support element 8. As will be explained more clearly below, the plug end 7 can extend into openings 9 of the printed circuit board 3 and be electrically contacted there. The support elements 8 are designed to be lug-shaped or stud-shaped and project laterally from the longitudinal extent of the plug elements 2 in an essentially perpendicular direction, as can be seen in FIG. 2a. After introduction of the plug elements 2 into the bottom housing part 1, the support elements 8 rest upon the side of the bottom housing part 1 that is uppermost in FIG. 1 and FIG. 2 (see also FIG. 2b).

In the process step that is completed in the progression from FIG. 1b to FIG. 1c, or in FIG. 2b to FIG. 2c, the printed circuit board 3 is placed on the plug elements 2 from above such that the plug ends 7 extend into, and if applicable through, the openings 9 of the printed circuit board. This is clearly visible in the cross-sectional side view in FIG. 2c, for example.

In a next process step, electrical components 4 are placed on the printed circuit board 3 from above. Generally, the electrical components 4 are SMD components. The electrical components 4 and the plug ends 7 of the plug elements 2 are subsequently soldered to the printed circuit board 3.

In the process step that is completed in the progression from FIG. 1d to FIG. 1e, or in FIG. 2d to FIG. 2e, the top housing part 5 is placed on the soldered circuit from above until it latches onto the bottom housing part 1 as explained in greater detail below. As can be seen particularly well in FIG. 2, the housing 5 includes at least one housing rib 10 that extends from left to right through the top housing part 5 in FIG. 2. In the example embodiment shown, three downward-extending, stud-shaped pressure elements 11 can be seen on the underside of this housing rib 10. It is clear from the detail view for FIG. 2e that the studs 11 of the housing ribs 10 rest against the printed circuit board 3 from above after placement of the top housing part 5.

It is clear from FIG. 3, especially FIG. 3e, that latching projections 12 are placed on the top housing part 5 which can engage beneath corresponding detents 13 on the bottom housing part 1 from below. In this way, a rigid mechanical connection between the top housing part 5 and the bottom housing part 1 is produced.

The support elements 8 achieve the result that the soldered joint between the plug ends 7 and the printed circuit board 3 is not mechanically stressed in the event of a tensile force on the plug ends 2 that is directed downward in FIG. 3. Instead, the tensile force is transmitted to the bottom housing part 1 by the support elements 8.

Moreover, in the event of a compressive force on the plug elements 2 from below in FIG. 3, the soldered joint between the plug ends 7 and the printed circuit board 3 is likewise not mechanically stressed, firstly because the support elements 8 rest against the printed circuit board 3 from below and transmit the compressive force to it. Secondly, the pressure elements 11 of the top housing part 5 rest against the printed circuit board 3 from above, so that the forces acting from below on the conductive elements 2 are transmitted to the top housing part 5.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A housing with an electrical circuit accommodated therein, in particular for use in a motor vehicle, comprising:

a top housing part;

a bottom housing part;

at least one printed circuit board that is separated at least in part from the bottom housing part and has at least one electrical component; and at least one plug element that extends through the bottom housing part and has a plug end that extends into and/or through the printed circuit board from the side of the latter that faces the bottom housing part and is electrically contacted in the area of the printed circuit board, the at least one plug element having at least one support element that extends from the plug element in the space between the bottom housing part and the printed circuit board in such a way that a section of it rests against the side of the bottom housing part facing the printed circuit board.

2. The housing in accordance with claim 1, wherein a section of the at least one support element rests against the side of the printed circuit board facing the bottom housing part.

3. The housing in accordance with claim 1, wherein the at least one support element extends essentially perpendicular from the plug element with regard to the direction of connection between the bottom housing part and the printed circuit board.

4. The housing in accordance with claim 1, wherein the support element is essentially lug-shaped or stud-shaped.

5. The housing in accordance with claim 1, wherein the top housing part has at least one housing rib, upon which is arranged the at least one pressure element.

6. The housing in accordance with claim 1, wherein the at least one pressure element is stud-shaped.

7. The housing in accordance with claim 1, wherein the bottom housing part is essentially plate-shaped.

8. The housing in accordance with claim 1, wherein the top housing part and the bottom housing part are fastened to each other by a snap-in connection, and wherein latching projections located on the top housing part are engagable behind detents located on the bottom housing part.

9. The housing in accordance with claim 1, wherein the at least one electrical component is a surface mount device (SMD) component.

* * * * *